(12) United States Patent
Oshima et al.

(10) Patent No.: US 10,583,789 B2
(45) Date of Patent: Mar. 10, 2020

(54) FIXING DEVICE FOR PANEL MEMBER

(71) Applicant: ALPINE ELECTRONICS, INC., Tokyo (JP)

(72) Inventors: Shigeyuki Oshima, Iwaki (JP); Ken Koiwa, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 0 days.

(21) Appl. No.: 16/115,931

(22) Filed: Aug. 29, 2018

(65) Prior Publication Data

US 2019/0100153 A1    Apr. 4, 2019

(30) Foreign Application Priority Data

Oct. 4, 2017   (JP) ................................. 2017-194339

(51) Int. Cl.
| | | |
|---|---|---|
| *B60R 11/02* | (2006.01) | |
| *F16M 13/02* | (2006.01) | |
| *H05K 5/02* | (2006.01) | |
| *H05K 5/00* | (2006.01) | |
| *B60K 35/00* | (2006.01) | |
| *B60K 37/02* | (2006.01) | |

(Continued)

(52) U.S. Cl.
CPC .......... *B60R 11/0235* (2013.01); *B60K 35/00* (2013.01); *B60K 37/02* (2013.01); *F16M 13/02* (2013.01); *H05K 5/0017* (2013.01); *H05K 5/0217* (2013.01); *B60K 2370/152* (2019.05); *B60K 2370/81* (2019.05); *B60R 2011/0052* (2013.01); *F16B 5/02* (2013.01)

(58) Field of Classification Search
CPC ........ B60R 11/0235; B60R 2011/0052; B60K 37/02; B60K 35/00; B60K 2370/81; B60K 2370/152; F16B 5/02; H05K 5/0217; H05K 5/0017; F16M 13/02
See application file for complete search history.

(56) References Cited

U.S. PATENT DOCUMENTS 4,895,326 A    1/1990  Nimpoeno et al.
5,743,606 A *  4/1998  Scholder ................. F16B 12/26
                                                     220/786

(Continued)

FOREIGN PATENT DOCUMENTS

JP    2016-122151 A    7/2016

OTHER PUBLICATIONS

Extended European Search Report for European Patent Application No. 18198259.6 dated Feb. 1, 2019; 8 pages.

*Primary Examiner* — Abhishek M Rathod
(74) *Attorney, Agent, or Firm* — Brinks Gilsson & Lione

(57) ABSTRACT

A panel case of a display panel is provided with a first fixing piece extending rearward (in the Y2 direction), and a female threaded hole is formed in the first fixing piece. A support bracket is provided with a second fixing piece extending rearward (in the Y2 direction), and an attachment hole is formed in the second fixing piece. The first fixing piece has a first elongate hole portion opened between the female threaded hole and a first base portion, and the second fixing piece has a second elongate hole portion formed between the attachment hole and a second base portion. Therefore, the fastening force from a fixing screw is less likely to be transmitted to the first base portion of the first fixing piece, and strain of the display panel can be regulated.

6 Claims, 8 Drawing Sheets

(51) Int. Cl.
*B60R 11/00* (2006.01)
*F16B 5/02* (2006.01)

(56) References Cited

U.S. PATENT DOCUMENTS

| | | | | |
|---|---|---|---|---|
| 6,424,391 | B1* | 7/2002 | Tsukamoto | G02F 1/133308 349/58 |
| 7,298,563 | B1 | 11/2007 | Peng | |
| 2004/0119907 | A1* | 6/2004 | Ahn | G02F 1/133308 349/58 |
| 2004/0189889 | A1* | 9/2004 | Nitto | G02F 1/133308 349/58 |
| 2007/0273808 | A1* | 11/2007 | Hsu | G02F 1/133308 349/58 |
| 2008/0029669 | A1 | 2/2008 | Olah et al. | |
| 2014/0254192 | A1* | 9/2014 | Do | G02B 6/0051 362/606 |
| 2016/0187711 | A1* | 6/2016 | Kida | G02F 1/13338 349/12 |
| 2018/0245614 | A1* | 8/2018 | Kato | F01N 13/14 |

* cited by examiner

FIG. 2
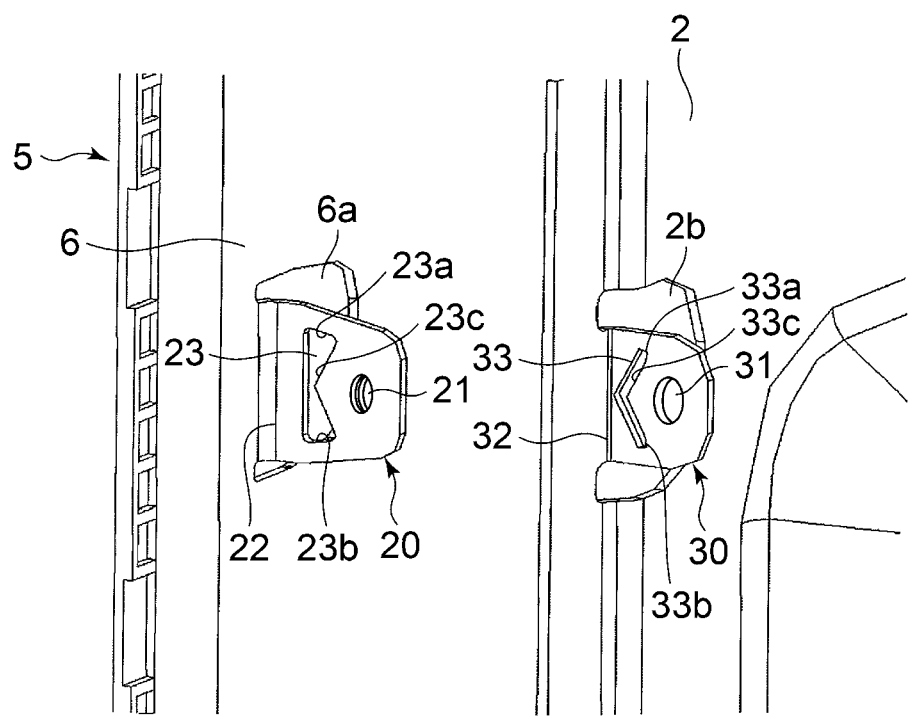
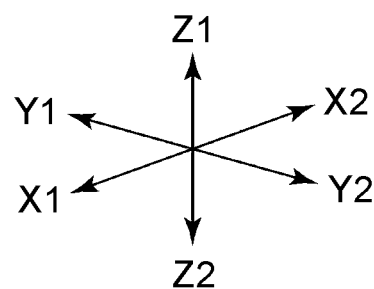

FIG. 3A
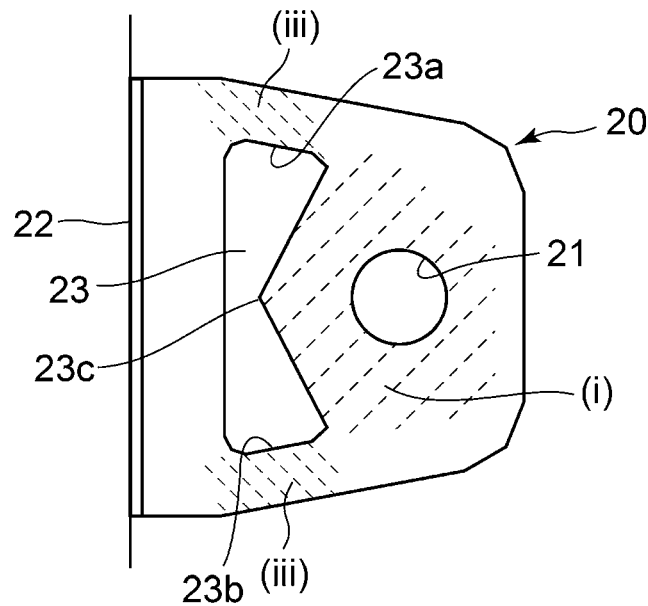
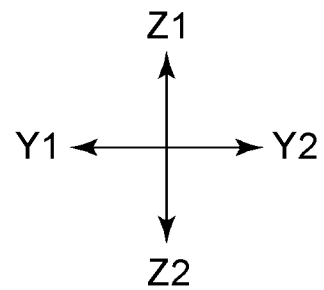
FIG. 3B
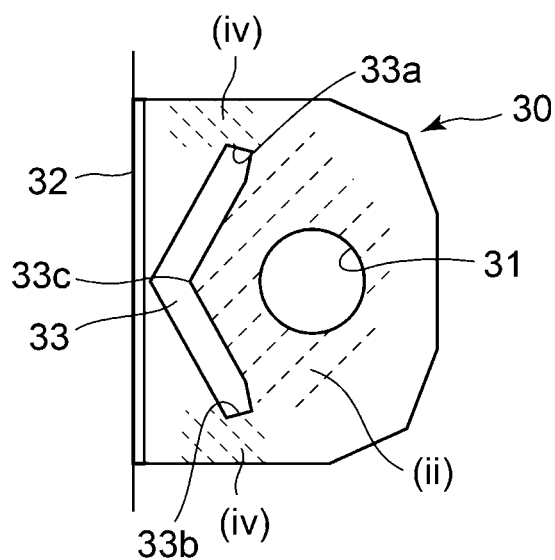

FIXING DEVICE FOR PANEL MEMBER

RELATED APPLICATIONS

The present application claims priority to Japanese Patent Application Number 2017-194339, filed Oct. 4, 2017, the entirety of which is hereby incorporated by reference.

BACKGROUND

1. Field

The present disclosure relates to a fixing device capable of preventing the fastening force, when fixing a panel member such as an in-vehicle display panel to a support bracket, from causing strain in the panel member.

2. Description of the Related Art

In a fixing device for fixing an in-vehicle display panel or the like to a support bracket, it is necessary that the fastening force, when fixing the display panel to the support bracket, does not cause strain in the display panel.

Japanese Unexamined Patent Application Publication No. 2016-122151 describes an invention relating to an in-vehicle display device. This display device has a bracket for holding a display cell. The bracket is formed of a metal plate, and the bracket is provided with an attachment piece extending toward the inside of the device. A holding member is fixed to the inside of the device, and the holding member is formed of a metal plate. The attachment piece extending from the bracket is sandwiched between the holding member and an opposed member, and the holding member and the opposed member are fixed with an attachment screw.

In this fixing device, the attachment hole formed in the attachment piece is made larger than the diameter of the shaft portion of the attachment screw, so that, in the attachment process using the attachment screw, the restraining force in the Z direction, which is the direction in which the attachment piece extends, is less likely to be transmitted to the bracket and the display cell held by the bracket. In addition, the attachment piece is made elastically deformable, so that the restraining force in the X direction, which is the elastic deformation direction of the attachment piece, is less likely to act on the bracket and the display cell held by the bracket.

The display device described in Japanese Unexamined Patent Application Publication No. 2016-122151 has an advantage in that it is possible to reduce the restraining force in the Z direction and the restraining force in the X direction that try to act on the bracket when attaching the bracket holding the display cell to the support.

However, when the display cell becomes large, and the masses of the display cell and the bracket become large, in order to effectively prevent the display cell from moving due to vehicle body vibration or the like, it is necessary to increase the rigidity of the attachment piece extending from the bracket, for example, by increasing the plate thickness. However, if the rigidity of the attachment piece is increased, the fastening force when screwing the attachment piece to the device is likely to be transmitted from the attachment piece to the display cell, and strain is likely to occur in the display cell. As a result, when the display cell is lit and a dark color such as black is displayed on the display screen, the probability increases that black unevenness or the like will occur.

SUMMARY

The present disclosure has been made to solve the above-mentioned conventional problems. It is an object of the present disclosure to provide a fixing device for a panel member that can firmly fix a panel member, such as a display panel, and has a structure such that the fastening force, when fixing the display panel, is less likely to cause strain in the display panel.

According to an aspect of the present disclosure, a fixing device for a panel member is configured to fix a panel member located anteriorly and a support bracket located posteriorly. The panel member is provided with a first fixing piece extending rearward, the support bracket is provided with a second fixing piece, the first fixing piece is provided with a first fastening portion, and the second fixing piece is provided with a second fastening portion. A first elongate hole portion located between a first base portion of the first fixing piece and the first fastening portion is formed in the first fixing piece, and a second elongate hole portion located between a second base portion of the second fixing piece and the second fastening portion is formed in the second fixing piece.

It is preferable that the first fastening portion and the second fastening portion be fastened with a fixing screw, with a first displacement portion including a region around the first fastening portion and a region between the first fastening portion and the first elongate hole portion in the first fixing piece, and with a second displacement portion including a region around the second fastening portion and a region between the second fastening portion and the second elongate hole portion in the second fixing piece, displaced in directions approaching each other.

It is preferable that one of the first fastening portion and the second fastening portion be an attachment hole into which a fixing screw is inserted and the other be a female threaded hole.

It is preferable that a first fastening portion side edge of the first elongate hole portion have a bent or curved shape protruding toward the first base portion of the first fixing piece, and a second fastening portion side edge of the second elongate hole portion have a bent or curved shape protruding toward the second base portion of the second fixing piece.

It is preferable that the second fixing piece extend rearward from the support bracket.

It is preferable that the second fixing piece extend forward from the support bracket.

It is preferable that the panel member be a display panel.

In the fixing device for a panel member of the present disclosure, each of the first fixing piece provided in the panel member and the second fixing piece provided in the support bracket has a hole portion located between the base portion thereof and the fastening portion thereof. A first displacement portion including at least a region between the first fastening portion and the first elongate hole portion in the first fixing piece, and a second displacement portion including at least a region between the second fastening portion and the second elongate hole portion in the second fixing piece, are displaced in directions approaching each other. As a result, the first fixing piece and the second fixing piece can be elastically deformed in directions approaching each other. Therefore, even if the rigidity of the first fixing piece and the second fixing piece is increased so that the panel member can be firmly held, the fastening force acting on the first fastening portion is less likely to be transmitted to the first base portion of the first fixing piece, a stress greater than necessary is not applied to the panel member, and large strain can be prevented from occurring in the panel member.

BRIEF DESCRIPTION OF THE DRAWINGS

FIG. 2 is an enlarged partial exploded perspective view showing a first fixing piece and a second fixing piece of the fixing device for an in-vehicle display panel shown in FIG. 1;

FIG. 3A is an enlarged side view of the first fixing piece, and FIG. 3B is an enlarged side view of the second fixing piece;

DESCRIPTION OF THE PREFERRED EMBODIMENTS

Figure 1:
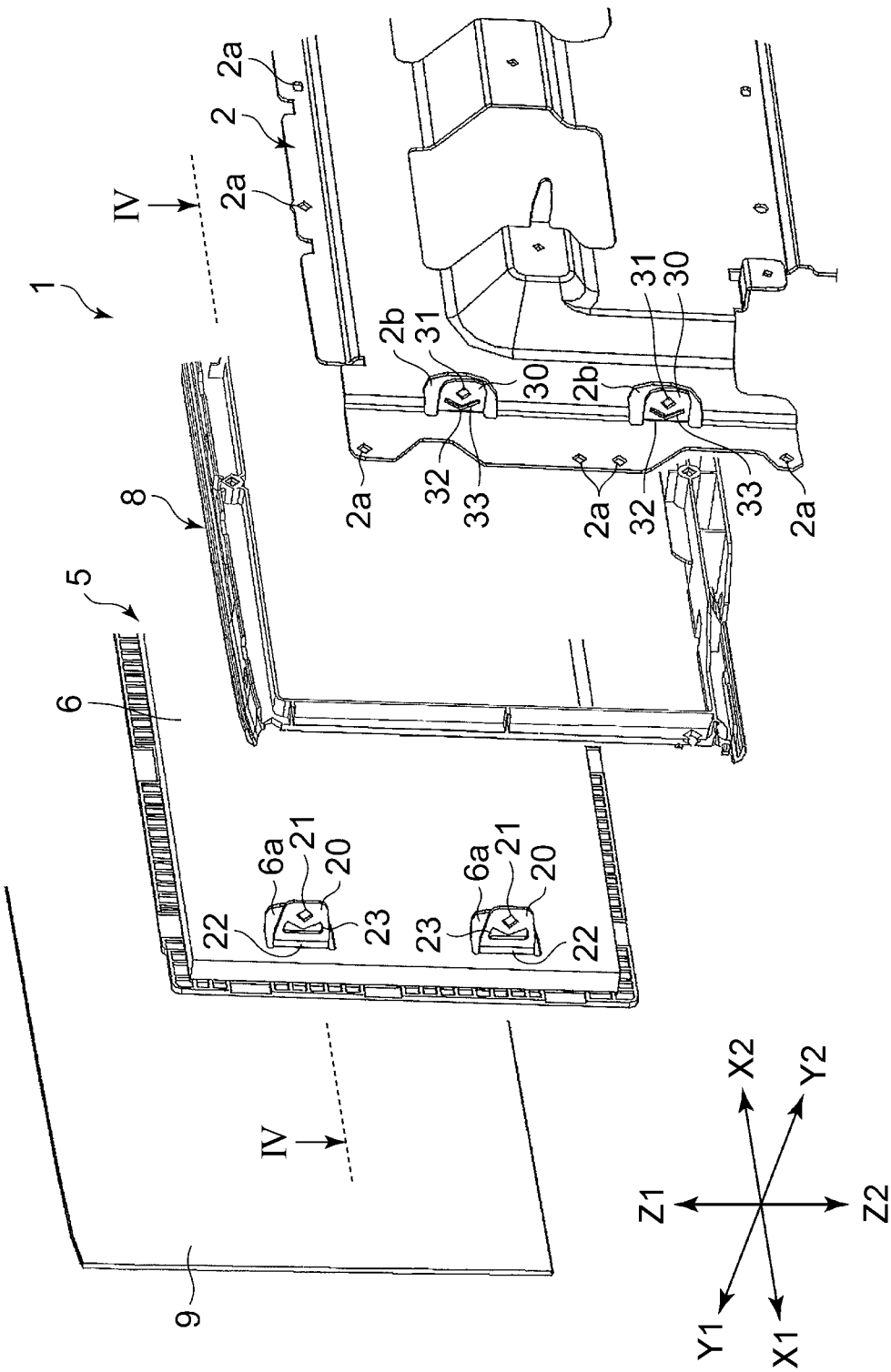
FIG. 1 is an exploded perspective view showing a fixing device for an in-vehicle display panel, as viewed from behind the display panel, as a first embodiment of a fixing device for a panel member of the present disclosure.

FIGS. 1 and 2 show a fixing device 1 for an in-vehicle display panel as a first embodiment of a fixing device for a panel member of the present disclosure. In the fixing device 1, the Y1 direction is the forward direction facing the inside of the vehicle cabin, the Y2 direction is the rearward direction which is the vehicle traveling direction, the X1 direction is the left direction, the X2 direction is the right direction, the Z1 direction is the upward direction, and the Z2 direction is the downward direction.

Figure 4:
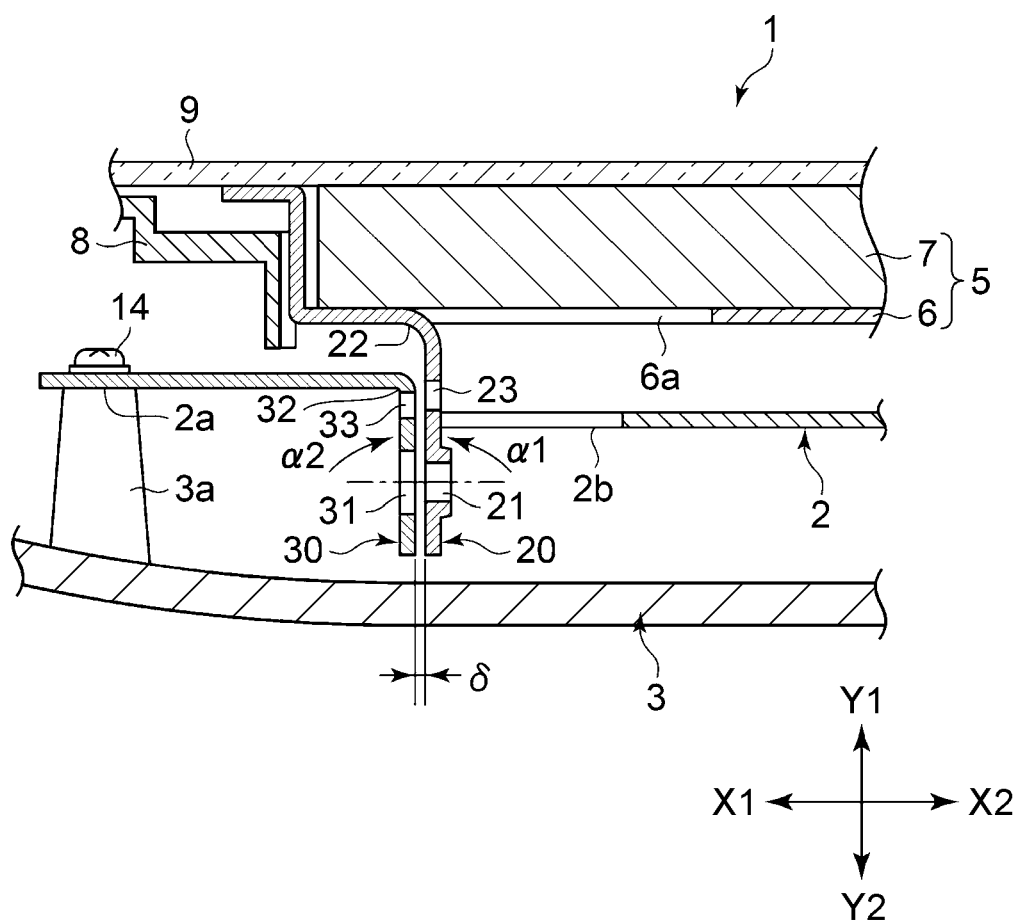
FIG. 4 is a partial sectional view of the fixing device for an in-vehicle display panel taken along line IV-IV of FIG. 1, and shows a state before the first fixing piece and the second fixing piece are fastened.

As shown in FIG. 1, the fixing device 1 for an in-vehicle display panel is provided with a support bracket 2 on the rear side (Y2). The support bracket 2 is formed by bending a metal plate. Support holes 2a are formed in the support bracket 2 at a plurality of positions. As shown in FIG. 4, a housing 3 is provided behind the fixing device 1. The housing is formed of synthetic resin material or light metal material. Support bosses 3a protruding forward (Y1 direction) are provided on the housing 3 at a plurality of positions, and the support holes 2a formed in the support bracket 2 are fixed to the tip portions of the support bosses 3a with fixing screws 14.

A display panel 5 is fixed in front (Y1 direction) of the support bracket 2. As shown in the sectional view of FIG. 4, the display panel 5 has a display cell 7 and a panel case 6 covering the display cell 7 from the rear (Y2 direction) and the surrounding portion. The display cell 7 is a color liquid crystal display cell having a backlight, an electroluminescence display cell or the like. The panel case 6 is formed by bending a metal plate.

As shown in FIGS. 1 and 4, a frame case 8 is provided around the display panel 5. The frame case 8 surrounds the entire periphery of the display panel 5, and is sandwiched and fixed between the support bracket 2 and the display panel 5. Alternatively, the frame case 8 is fixed to the support bracket 2. A cover panel 9 is fixed to the front surface of the display panel 5 that faces forward (Y1 direction) and the front part of the frame case 8. The cover panel 9 is a glass panel or a transparent synthetic resin panel.

As shown in FIGS. 1 and 2, in the fixing device 1, a first fixing piece 20 extending rearward (in the Y2 direction) from the panel case 6 constituting the display panel 5 and a second fixing piece 20 extending rearward (in the Y2 direction) from the support bracket 2 are provided. The first fixing piece 20 and the second fixing piece 30 are provided at a plurality of positions on each of the X1 side and the X2 side. The first fixing piece 20 is cut out from a part of the metal plate constituting the panel case 6, and is formed by being bent perpendicularly rearward (in the Y2 direction). The second fixing piece 30 is cut out from a part of the metal plate constituting the support bracket 2 and is formed by being bent perpendicularly rearward (in the Y2 direction).

As shown in FIGS. 1 and 2, an opening 2b is formed in the support bracket 2 when cutting and raising the second fixing piece 30. When the display panel 5 is placed in front of the support bracket 2, the first fixing piece 20 is inserted rearward (in the Y2 direction) into the opening 2b, and as shown in FIG. 4, the first fixing piece 20 and the second fixing piece 30 are opposed to each other in the X1-X2 direction.

Figure 5:
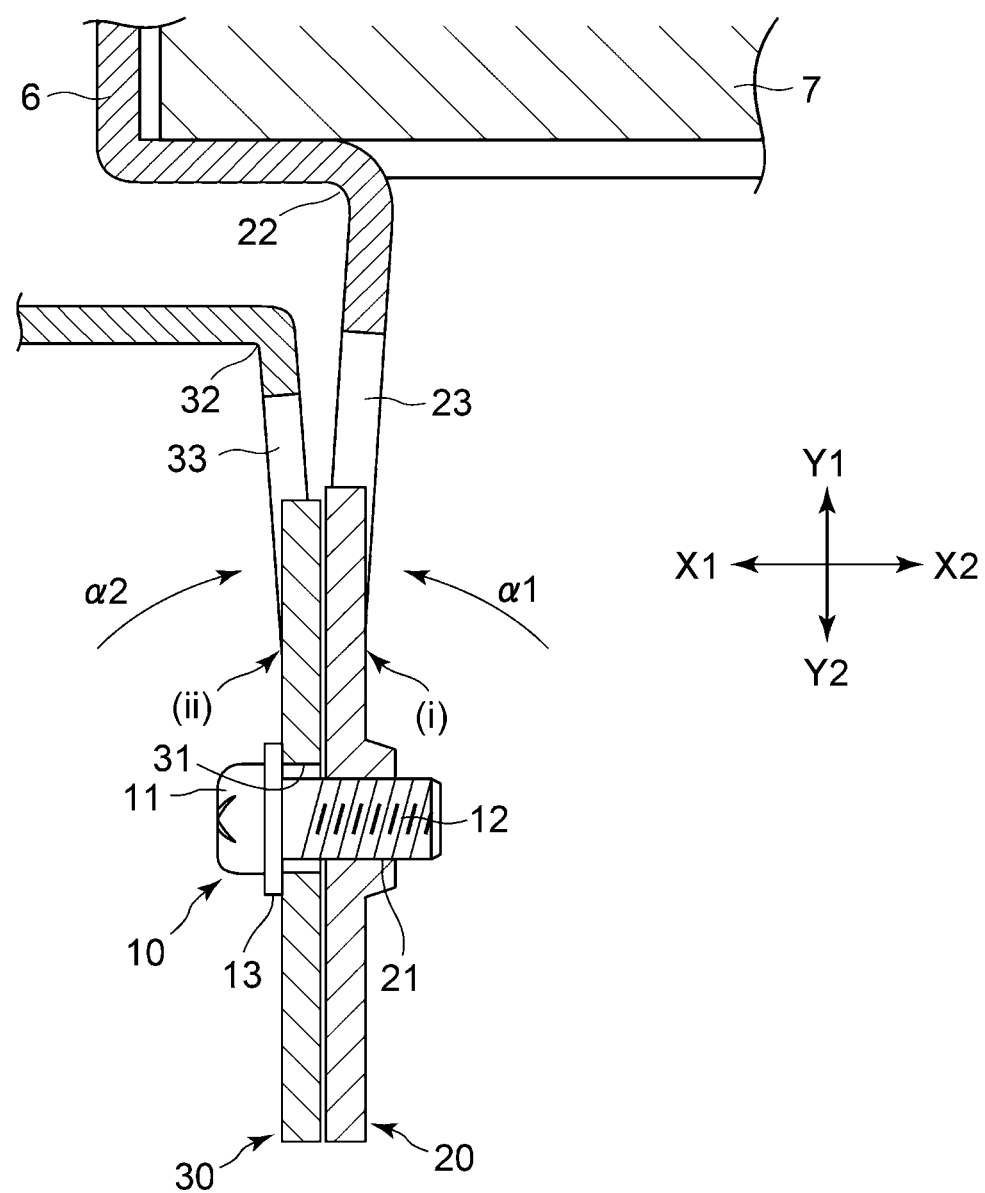
FIG. 5 is a partially enlarged sectional view showing a state in which the first fixing piece and the second fixing piece are fastened.

As shown in an enlarged view in FIG. 2, an opening 6a for cutting out the first fixing piece 20 is formed in the panel case 6 of the display panel 5. The first fixing piece 20 is bent perpendicularly rearward (in the Y2 direction) starting from a first base portion 22 located at the edge of the opening portion 6a. In the first fixing piece 20, a female threaded hole 21 is formed as a first fastening portion. As shown in FIGS. 4 and 5, a hole raised in the X2 direction is formed in the first fixing piece 20 by a so-called "burring process," and the inside of this hole is tapped to form the female threaded hole 21.

As shown in FIGS. 2 and 3A, in the first fixing piece 20, a first elongate hole portion 23 is formed between the female threaded hole 21 and the first base portion 22. The first elongate hole portion 23 is formed to be wider than the diameter of the female threaded hole 21 in the width direction (Z1-Z2 direction) of the first fixing piece 20. That is, the Z1-side end portion 23a of the first elongate hole portion 23 is located on the Z1 side of the Z1-side edge of the female threaded hole 21, and the Z2-side end portion 23b of the first elongate hole portion 23 is located on the Z2 side of the Z2-side edge of the female threaded hole 21. The female threaded hole 21 side edge 23c of the first elongate hole portion 23 is bent so as to have a protruding shape toward the first base portion 22. That is, the edge 23c has a bent shape in which the corner portion is directed toward the first base portion 22.

The second fixing piece 30 is bent perpendicularly rearward (in the Y2 direction) starting from a second base portion 32 located at the edge of the opening 2b. An attachment hole 31 is formed in the second fixing piece 30 as a second fastening portion.

As shown in FIGS. 2 and 3B, in the second fixing piece 30, a second elongate hole portion 33 is formed between the attachment hole 31 and the second base portion 32. The second elongate hole portion 33 is formed to be longer than the diameter of the attachment hole 31 in the width direction (Z1-Z2 direction) of the second fixing piece 30. That is, the Z1-side end portion 33a of the second elongate hole portion 33 is located on the Z1 side of the Z1-side edge of the attachment hole 31, and the Z2-side end portion 33b of the second elongate hole portion 33 is located on the Z2 side of the Z2-side edge of the attachment hole 31.

The second elongate hole portion 33 is a bent elongated hole having a protruding shape toward the second base portion 32, and the female threaded hole 31 side edge 33c of the second elongate hole portion 33 is bent so as to have a protruding shape toward the second base portion 32, that is, in a state in which the corner portion is directed toward the second base portion 32.

Next, the assembling process of the fixing device 1 for a display panel will be described.

The display panel 5 is placed in front (Y1 direction) of the support bracket 2. At this time, the frame case 8 is sandwiched between the support bracket 2 and the display panel 5, and the frame case 8 surrounds the entire periphery of the display panel 5.

As shown in FIG. 4, by inserting the first fixing piece 20 provided on the panel case 6 of the display panel 5 into the opening 2b formed in the support bracket 2 in the Y2 direction, the first fixing piece 20 and the second fixing piece 30 are opposed to each other in the X1-X2 direction. The design dimensions of the panel case 6 and the support bracket 2 are determined such that the distance in the X1-X2 direction between the first fixing pieces 20 provided on the X1 side and the X2 side of the panel case 6 is slightly shorter than the distance in the X1-X2 direction between the second fixing pieces 30 provided on the X1 side and the X2 side of the support bracket 2. Therefore, as shown in FIG. 4, a distance δ of about 0.1 to 0.4 mm is set in the X1-X2 direction between the first fixing piece 20 and the second fixing piece 30.

As shown in FIG. 5, a fixing screw 10 is used as a fastening member for fastening the first fixing piece 20 and the second fixing piece 30. The fixing screw 10 has a head portion 11 and a shaft portion 12 on which a male thread is formed. The shaft portion 12 of the fixing screw 10 is inserted in the attachment hole 31 formed in the second fixing piece 30 in the X2 direction, and at this time, a washer 13 is interposed between the second fixing piece 30 and the head portion 11 of the fixing screw 10. By screwing the male thread of the shaft portion 12 of the fixing screw 10 into the female threaded hole 21 of the first fixing piece 20 and tightening the fixing screw 10, the first fixing piece 20 and the second fixing piece 30 are fixed to each other and the display panel 5 is fixed to the front of the support bracket 2.

As shown in FIG. 3B, in the second fixing piece 30, the second elongate hole portion 33 is formed between the attachment hole 31 and the second base portion 32, and the second elongate hole portion 33 has an edge 33c bent in a protruding shape in the direction of the second base portion 32. Therefore, when the fastening force of the fixing screw 10 acts, a second displacement portion (ii), including a region around the attachment hole 31 (the second fastening portion) and a region between the attachment hole 31 and the second elongate hole portion 33, is displaced toward the first fixing piece 20 in the α2 direction shown in FIGS. 4 and 5. At this time, second deformation portions (iv) that are located on both the Z1 side and the Z2 side of the second elongate hole portion 33, and are regions between the second displacement portion (ii) and the second base portion 32, are elastically deformed.

As shown in FIG. 3A, also in the first fixing piece 20, the first elongate hole portion 23 is formed between the female threaded hole 21 and the first base portion 22, and the first elongate hole portion 23 has an edge 23c bent in a protruding shape in the direction of the first base portion 22. Therefore, when the fastening force of the fixing screw 10 acts, a first displacement portion (i), including a region around the female threaded hole 21 (the first fastening portion) and a region between the female threaded hole 21 and the first elongate hole portion 23, is displaced toward the second fixing piece 30 in the α1 direction shown in FIGS. 4 and 5. At this time, first deformation portions (iii) that are located on both the Z1 side and the Z2 side of the first elongate hole portion 23, and are regions between the first displacement portion (i) and the first base portion 22, are elastically deformed.

In the first fixing piece 20, the first elongate hole portion 23 having a large width dimension in the Z1-Z2 direction is formed between the female threaded hole 21 and the first base portion 22, and therefore when the fastening force of the fixing screw 10 acts on the female threaded hole 21, the fastening stress and the bending strain generated in the first displacement portion (i) and the first deformation portions (iii) are less likely to directly act on the first base portion 22. In the second fixing piece 30, the second elongate hole portion 33 having a large width dimension in the Z1-Z2 direction is formed, and therefore when the fastening force of the fixing screw 10 acts on the attachment hole 31, the second displacement portion (ii) and the second deformation portions (iv) are displaced toward the first displacement portion (i) of the first fixing piece 20. Therefore, the displacement amount and the deformation amount of the first displacement portion (i) and the first deformation portions (iii) of the first fixing piece 20 can be reduced, and the fastening stress and the bending strain itself generated in the first fixing piece 20 are reduced.

Therefore, even if the rigidity of the first fixing piece 20 and the second fixing piece 30 is increased so that the display panel 5 having a large mass can be firmly held, it is possible to relax the stress acting on the first base portion 22 of the first fixing piece 20 due to the tightening of the fixing screw 10, and to prevent strain from occurring in the display cell 7, or to reduce strain. As a result, when the display panel 5 is lit, occurrence of black unevenness or the like due to strain can be suppressed.

When fastening the first fixing piece 20 and the second fixing piece 30 with the fixing screw 10, both the first displacement portion (i), including the female threaded hole 21 as the first fastening portion of the first fixing piece 20, and the second displacement portion (ii), including the attachment hole 31 as the second fastening portion of the second fixing piece 30, are deformed in directions approaching each other. At this time, the first displacement portion (i) and the second displacement portion (ii) are preferably deformed by substantially the same amount in directions approaching each other, from the viewpoint of relaxing the fastening stress acting on the first base portion 22 of the first fixing piece 20 and increasing the strength of supporting the panel by the first fixing piece 20 and the second fixing piece 30. However, as long as both the first displacement portion (i) and the second displacement portion (ii) can be displaced in directions approaching each other, the amount of displacement may be different between the first displacement portion (i) and the second displacement portion (ii), and the rigidity may be different between the first fixing piece 20 and the second fixing piece 30.

Here, a structure in which the rigidity of the first fixing piece 20 is made lower than that of the second fixing piece 30, for example, by decreasing the plate thickness of the first fixing piece 20, and only the first fixing piece 20 is provided with the first elongate hole portion 23, and the second elongate hole portion 32 is not formed in the second fixing piece 30, is referred to as a comparative example. Also in this comparative example, an effect of forming the first elongate hole portion 23 is that the fastening stress acting on the first base portion 22 of the first fixing piece 20 can be relaxed. However, in this comparative example, since the rigidity of the first fixing piece 20 is low, the strength of supporting the panel member by the fixing device composed of both the first fixing piece 20 and the second fixing piece 30 is extremely lowered. In contrast, in the fixing device 1 of the above embodiment, the holes 23 and 33 are formed in the first fixing piece 20 and the second fixing piece 30, and the first displacement portion (i) and the second displacement portion (ii) are deformed in the same manner. Therefore, it is possible to increase the rigidity of both the first fixing piece 20 and the second fixing piece 30 to increase the strength of supporting the panel member by the fixing device 1, and to reduce the influence of the fastening stress on the panel member.

Figure 6:
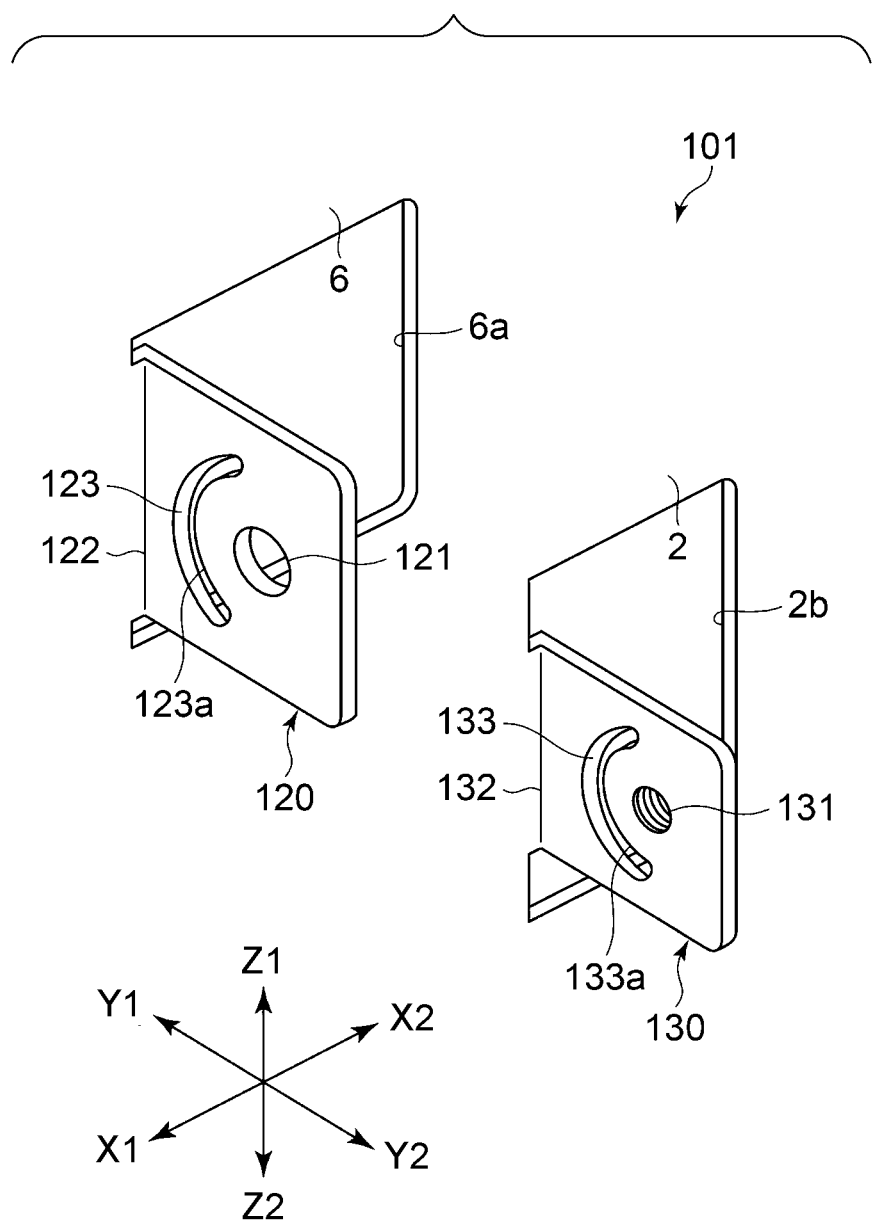
FIG. 6 is a partially exploded perspective view showing the shapes of a first fixing piece and a second fixing piece in a fixing device according to a second embodiment of the present disclosure.

FIG. 6 shows a part of a fixing device 101 for an in-vehicle display panel according to a second embodiment of the present disclosure.

In the fixing device 101, a first fixing piece 120 is bent rearward (in the Y2 direction) from the panel case 6 of the display panel 5. In the first fixing piece 120, an attachment hole 121 is formed as a first fastening portion. A second fixing piece 130 is bent rearward from the support bracket 2. In the second fixing piece 130, a female threaded hole 131 is formed as a second fastening portion. As described above, the first fastening portion formed in the first fixing piece may be an attachment hole, and the second fastening portion formed in the second fastening piece may be a female threaded hole. Alternatively, the first fastening portion formed in the first fixing piece may be a female threaded hole, and the second fastening portion formed in the second fastening piece may be an attachment hole.

In the first fixing piece 120, a first elongate hole portion 123 is formed between the attachment hole 121 and the base 122, and the attachment hole 121 side edge 123a of the first elongate hole portion 123 has a curved shape protruding toward the base 122. In the second fixing piece 130, a second elongate hole portion 133 is formed between the female threaded hole 131 and the base portion 132, and the female threaded hole 131 side edge 133a of the second elongate hole portion 133 has a curved shape protruding toward the base 132.

Figure 7:
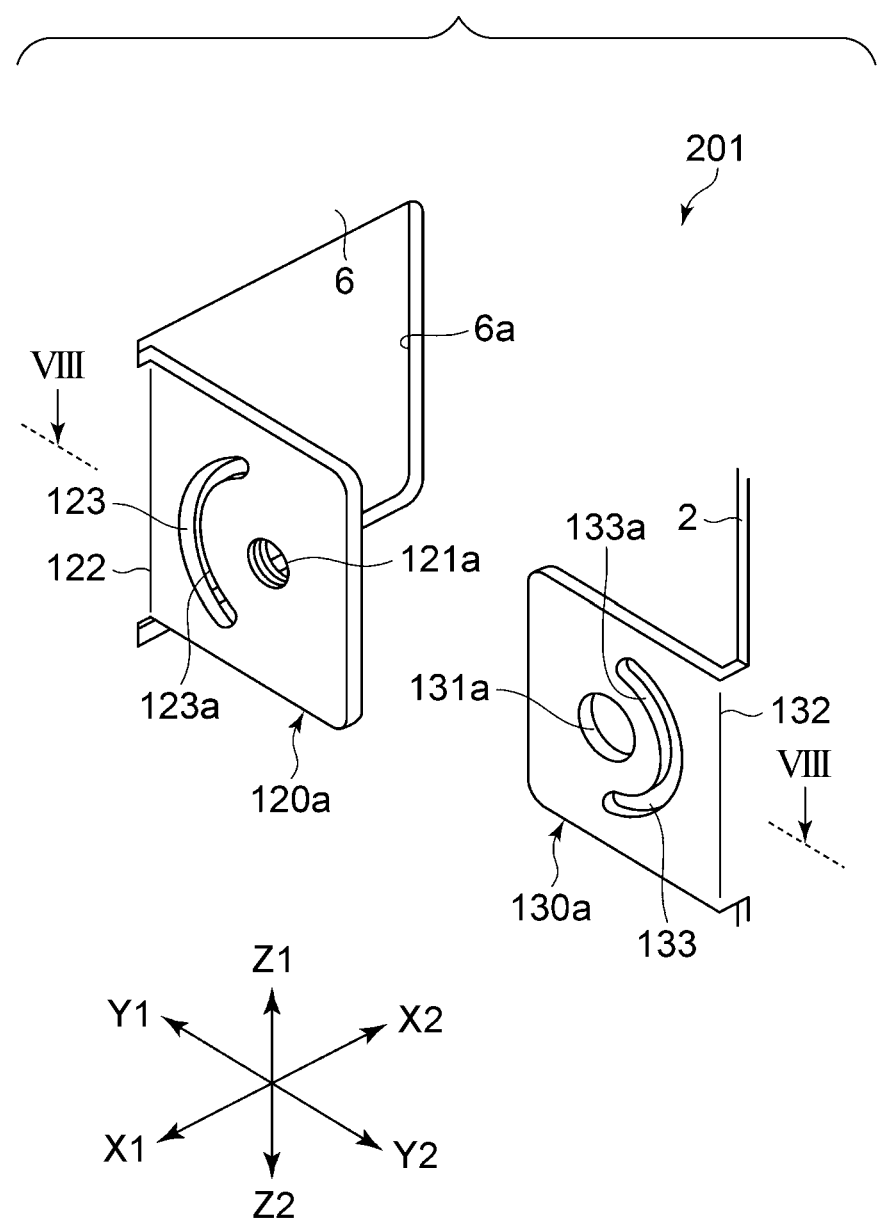
FIG. 7 is a partially exploded perspective view showing the shapes of a first fixing piece and a second fixing piece in a fixing device according to a third embodiment of the present disclosure.

FIG. 7 shows a fixing device 201 for an in-vehicle display panel according to a third embodiment of the present disclosure.

The fixing device 201 is provided with a first fixing piece 120a bent rearward (in the Y2 direction) from the panel case 6 of the display panel 5. The first fixing piece 120a has almost the same structure as the first fixing piece 120 shown in FIG. 6, but in the first fixing piece 120a shown in FIG. 7, the first fastening portion is a female threaded hole 121a. A second fixing piece 130a is bent from the support bracket 2, but unlike the embodiments shown in FIGS. 1 to 6, the second fixing piece 130a is bent forward (in the Y1 direction). The second fastening portion formed in the second fixing piece 130a is an attachment hole 131a. The shapes of the first elongate hole portion 123 and the second elongate hole portion 133 of the fixing device 201 shown in FIG. 7 are the same as those of the second embodiment shown in FIG. 6.

Figure 8:
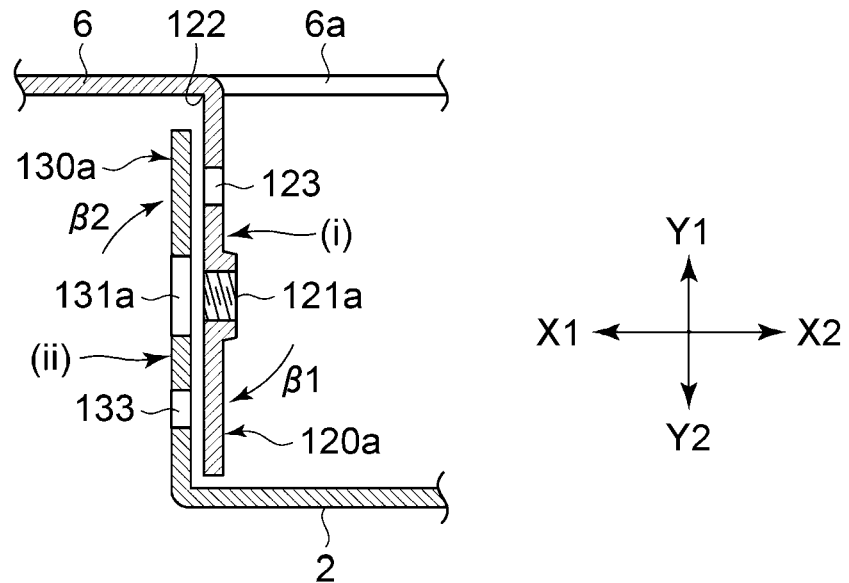
FIG. 8 shows a state in which the first fixing piece and the second fixing piece shown in FIG. 7 face each other, and is a partial sectional view taken along line VIII-VIII of FIG. 7.

FIG. 8 shows a state in which the first fixing piece 120a and the second fixing piece 130a of the third embodiment face each other in the X1-X2 direction. When the fixing screw 10 is inserted into the attachment hole 131a and screwed into the female threaded hole 121a and tightened, in the first fixing piece 120a, a first displacement portion (i), including a region around the female threaded hole 121a and a region between the female threaded hole 121a and the first elongate hole portion 123, attempts to deform in the β1 direction, and in the second fixing piece 130, a second displacement portion (ii), including a region around the attachment hole 131a and a region between the attachment hole 131a and the second elongate hole portion 133, attempts to deform in the β2 direction. The β1 direction and β2 direction are the same rotation direction (clockwise direction in FIG. 8). Therefore, the first displacement portion (i) of the first fixing piece 120a and the second displacement portion (ii) of the second fixing piece 130a are easily brought into surface contact with each other, and the first fixing piece 120a and the second fixing piece 130a are easily fastened with the fixing screw 10.

Figure 9:
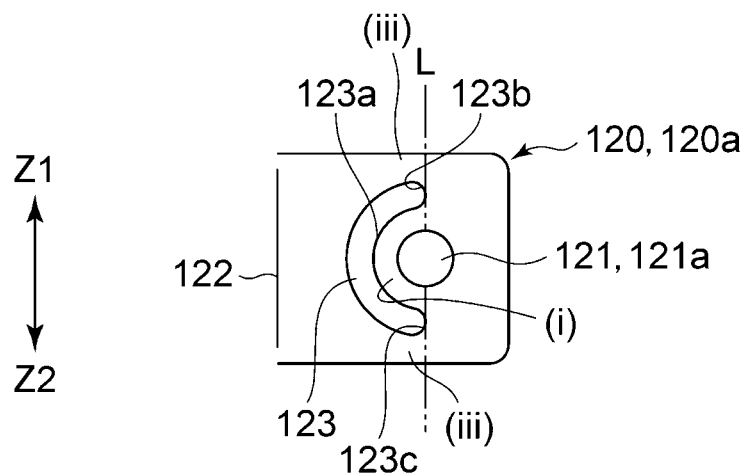
FIG. 9 is a side view of the first fixing piece shown in FIGS. 6 to 8.

FIG. 9 shows a side view of the first fixing piece 120 (120a) shown in FIGS. 6 to 8. The first fastening portion (121, 121a) side edge 123a of the first elongate hole portion 123 has a curved shape protruding toward the base portion 122. Alternatively, as in the first embodiment shown in FIG. 2, it has a bent shape protruding toward the base portion. Here, a line L connecting one end portion 123b and the other end portion 123c of the first elongate hole portion 123 passes through the first fastening portion 121 (121a). With this configuration, the first displacement portion (i), including the region around the first fastening portion 121 and the region between the first fastening portion 121 and the first elongate hole portion 123, is easily deformed.

Alternatively, when it is desired that, in the first fixing piece 120 extending from the display panel 5, the first displacement portion (i), including the first fastening portion, is hard to deform as compared with the second fixing piece 130, a configuration such that the line L does not pass through the first fastening portion is preferable.

In the above embodiments, the fastening member is a fixing screw 10, and one of the first fastening portion and the second fastening portion is a female threaded hole, but both the first fastening portion and the second fastening portion may be attachment holes and the fastening member may be composed of a screw or bolt and a nut.

The panel member is not limited to an in-vehicle display panel. As long as it appears on the surface of a device and the occurrence of strain at the time of attachment is desired to be prevented, it may be a surface panel, a decorative panel, or the like.

What is claimed is:

1. A fixing device for a panel member configured to fix the panel member located anteriorly to a support bracket located posteriorly, wherein the panel member is provided with a first fixing piece extending rearward, the support bracket is provided with a second fixing piece, the first fixing piece is provided with a first fastening portion, and the second fixing piece is provided with a second fastening portion;

wherein a first elongate hole portion in the first fixing piece is located between a first base portion of the first fixing piece and the first fastening portion, and a second elongate hole portion in the second fixing piece is located between a second base portion of the second fixing piece and the second fastening portion;

wherein the first fixing piece is bent rearward from a part of a metal plate constituting the panel member, and the second fixing piece is bent from a part of a metal plate constituting the support bracket, the first fixing piece and the second fixing piece being opposed to each other in a thickness direction; and, wherein a first fastening portion side edge of the first elongate hole portion has a bent or curved shape protruding toward the first base portion of the first fixing piece, and a second fastening portion side edge of the second elongate hole portion has a bent or curved shape protruding toward the second base portion of the second fixing piece.

2. The fixing device for the panel member according to claim 1, wherein the first fastening portion and the second fastening portion are fastened with a fixing screw, and a first displacement portion, including a region around the first fastening portion and a region between the first fastening portion and the first elongate hole portion in the first fixing piece, and a second displacement portion, including a region around the second fastening portion and a region between the second fastening portion and the second elongate hole portion in the second fixing piece, are displaced in directions approaching each other.

3. The fixing device for the panel member according to claim 1, wherein one of the first fastening portion and the second fastening portion is an attachment hole into which a fixing screw is inserted and the other is a female threaded hole.

4. The fixing device for the panel member according to claim 1, wherein the second fixing piece extends rearward from the support bracket.

5. The fixing device for the panel member according to claim 1, wherein the second fixing piece extends forward from the support bracket.

6. The fixing device for the panel member according to claim 1, wherein the panel member is a display panel.

* * * * *